US006484294B1

(12) United States Patent
Kiyoshige et al.

(10) Patent No.: US 6,484,294 B1
(45) Date of Patent: Nov. 19, 2002

(54) SEMICONDUCTOR INTEGRATED CIRCUIT AND METHOD OF DESIGNING THE SAME

(75) Inventors: Yoshikazu Kiyoshige, Hachioji (JP); Michinobu Nakao, Hachioji (JP); Kazumi Hatayama, Hitachinaka (JP); Takashi Hotta, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/462,913

(22) PCT Filed: Apr. 23, 1999

(86) PCT No.: PCT/JP99/02182

§ 371 (c)(1),
(2), (4) Date: Jan. 18, 2000

(87) PCT Pub. No.: WO00/65364

PCT Pub. Date: Nov. 2, 2000

(51) Int. Cl.[7] .................. G06F 17/50; G06F 11/00; G01R 31/28; H03K 19/00; H01L 25/00
(52) U.S. Cl. .................. 716/4; 716/8; 714/30; 714/731; 714/733; 714/744; 711/101; 326/16; 326/101; 326/93; 365/201; 365/72; 327/520; 327/565
(58) Field of Search .................. 716/1–21; 714/30, 714/731, 733, 744; 711/101; 326/16, 101, 93; 365/201, 72; 327/520, 565

(56) References Cited

U.S. PATENT DOCUMENTS

| | | | | |
|---|---|---|---|---|
| 4,698,588 A | * | 10/1987 | Hwang et al. | 324/73.1 |
| 4,718,065 A | * | 1/1988 | Boyle et al. | 714/725 |
| 4,947,395 A | * | 8/1990 | Bullinger et al. | 714/730 |
| 5,032,783 A | * | 7/1991 | Hwang et al. | 324/73.1 |
| 5,042,034 A | * | 8/1991 | Correale et al. | 714/727 |
| 5,132,974 A | * | 7/1992 | Rosales | 714/731 |
| 5,260,948 A | * | 11/1993 | Simpson et al. | 714/727 |
| 5,329,532 A | * | 7/1994 | Ikeda et al. | 714/731 |
| 5,349,587 A | * | 9/1994 | Nadeau-Dostie et al. | 714/729 |
| 5,485,473 A | * | 1/1996 | Diebold et al. | 714/724 |
| 5,673,277 A | * | 9/1997 | Amitai et al. | 714/726 |
| 5,887,004 A | * | 3/1999 | Walther | 714/726 |
| 6,021,514 A | * | 2/2000 | Koprowski | 714/733 |
| 6,032,278 A | * | 2/2000 | Parvathala et al. | 714/726 |
| 6,091,261 A | * | 7/2000 | De Lange | 326/38 |

FOREIGN PATENT DOCUMENTS

| | | | | |
|---|---|---|---|---|
| JP | 03061872 A | * | 3/1991 | G01R/31/28 |
| JP | 03089182 A | * | 4/1991 | G01R/31/28 |
| JP | 04072583 A | * | 3/1992 | G01R/31/28 |
| JP | 04118570 A | * | 4/1992 | G01R/31/28 |
| JP | 06148293 A | * | 5/1994 | G01R/31/28 |
| JP | 07198787 A | * | 8/1995 | G01R/31/28 |
| JP | 08147337 A | * | 6/1996 | G06F/17/50 |
| JP | 09091324 A | * | 4/1997 | G06F/17/50 |
| JP | 09269959 A | * | 10/1997 | G06F/17/50 |
| JP | 09274067 A | * | 10/1997 | G01R/31/28 |
| JP | 11052024 A | * | 2/1999 | G01R/31/28 |

OTHER PUBLICATIONS

NN9005377, "Serial Interface for Electronic Diagnostics", IBM Technical Disclosure Bulletin, vol. 32, No. 12, May 1990, pp. 377–383 (12 pages).*
Agrawal et al., "Design for Testability and Test Generation With Two Clocks", Fourth CSI/iEEE International Symposium on VLSI Design, Jan. 4–8, 1991, pp. 112–117.*
Einspahr et al., "Improving Circuit Testability by Clock Control", Proceedings of Sixth Great Lakes Symposium on VLSI, Mar. 22–23, 1996, pp. 288–293.*

* cited by examiner

*Primary Examiner*—Vuthe Siek
*Assistant Examiner*—Phallaka Kik
(74) *Attorney, Agent, or Firm*—Kenyon & Kenyon

(57) ABSTRACT

A method for designing a semiconductor integrated circuit while minimizing any increase in the area of its logic circuit under test. Circuit data about the semiconductor integrated circuit are received, and transition signal occurrence probabilities of all scanning function-equipped storage elements involved are computed by use of the circuit data. In keeping with the transition signal occurrence probabilities thus computed and based on predetermined parameters, the method permits selection of scanning function-equipped storage elements that may be replaced by delay test-ready scanning function-equipped storage elements.

7 Claims, 17 Drawing Sheets

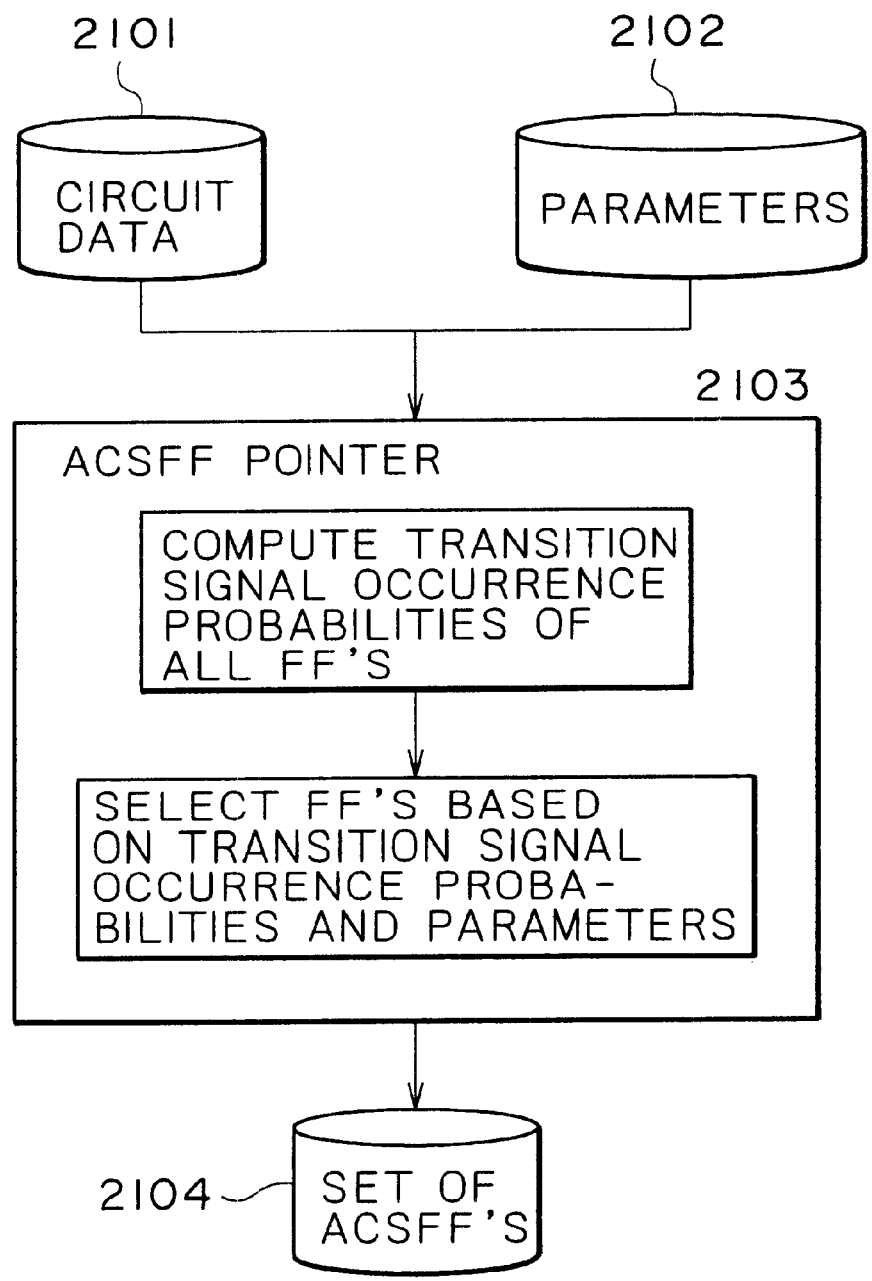

FIG. 3

| Gate | C1(t,k) | TR(k) | O(i) |
|---|---|---|---|
| ![inverter] i→○→k | C0(t,i) | TF(i) | O(k) |
| ![AND] i,j...→k | $\prod_j C1(t,j)$ | $\prod_j C1(2j) - \prod_j T1(j)$ | $O(k)\prod_{j\neq i} C1(2,j)$ |
| ![OR] i,j...→k | $1 - \prod_j C1(t,j)$ | $\prod_j C0(2,j) - \prod_j T0(j)$<br>$- C1(1,k) + C1(2,k)$ | $O(k)\prod_{j\neq i} C0(2,j)$ |
| ![XOR] i,j→k | $C1(t,i) + C1(t,j)$<br>$- 2C1(t,i)C1(t,j)$ | $TR(i)T0(j) + TF(i)T1(j)$<br>$+ TR(j)T0(i) + TF(j)T1(i)$ | $O(k)$ |
| ![fanout] i→k... | C1(t,i) | TR(i) | $1 - \prod_k (1-O(k))$ |
| SFF →k | 0.5 (t=1)<br>COMPUTED FROM INPUT (t=2) | COMPUTED SEPARATELY | — |
| AC SFF →k | 0.5 | 0.25 | — |

FIG. 8

| SIGNAL LINES (2801) | FF 1 (2802) | FF 2 (2803) | FF 3 (2804) | FF 4 (2805) |
|---|---|---|---|---|
| a | 0.000 | 0.500 | 0.500 | 0.500 |
| b | 0.500 | 0.000 | 0.500 | 0.500 |
| c | 0.500 | 0.500 | 0.000 | 0.500 |
| d | 0.500 | 0.500 | 0.500 | 0.000 |
| e | 0.500 | 0.500 | 0.500 | 0.500 |
| f | 0.000 | 0.250 | 0.250 | 0.250 |
| g | 0.000 | 0.000 | 0.125 | 0.125 |
| h | 0.000 | 0.000 | 0.000 | 0.063 |
| i | 0.000 | 0.000 | 0.000 | 0.000 |
| j | 0.500 | 0.500 | 0.500 | 0.500 |
| k | 0.500 | 0.250 | 0.500 | 0.500 |
| l | 0.500 | 0.500 | 0.125 | 0.500 |
| m | 0.500 | 0.500 | 0.500 | 0.063 |

FIG. 9

| SIGNAL LINES | C1(1,*) | C1(2,*) | TR(*) | O(*) | DP(*/R) | DP(*/F) |
|---|---|---|---|---|---|---|
| a | 0.500 | 0.500 | 0.250 | 1.000 | 0.250 | 0.250 |
| b | 0.500 | 0.500 | 0.125 | 1.000 | 0.125 | 0.125 |
| c | 0.500 | 0.500 | 0.063 | 1.000 | 0.063 | 0.063 |
| d | 0.500 | 0.500 | 0.031 | 1.000 | 0.031 | 0.031 |
| e | 0.500 | 0.500 | 0.000 | 1.000 | 0.000 | 0.000 |
| f | 0.250 | 0.250 | 0.125 | 1.000 | 0.125 | 0.125 |
| g | 0.125 | 0.125 | 0.078 | 1.000 | 0.078 | 0.078 |
| h | 0.063 | 0.063 | 0.042 | 1.000 | 0.042 | 0.042 |
| i | 0.031 | 0.031 | 0.022 | 1.000 | 0.022 | 0.022 |
| j | 0.500 | 0.500 | 0.250 | 1.000 | 0.250 | 0.250 |
| k | 0.500 | 0.500 | 0.188 | 1.000 | 0.188 | 0.188 |
| l | 0.500 | 0.500 | 0.121 | 1.000 | 0.121 | 0.121 |
| m | 0.500 | 0.500 | 0.068 | 1.000 | 0.068 | 0.068 |

Labels: 2901, 2902, 2903, 2904, 2905, 2906, 2907

FIG. 10

| | 1 | 2 | 3 | 4 |
|---|---|---|---|---|
| fc | 10.48 | 13.59 | 16.11 | 17.71 |
| fc(1) | 10.48 | 13.59 | 16.11 | 17.71 |
| fc(2) | 12.25 | 15.31 | 17.71 | – |
| fc(3) | 13.07 | 16.11 | – | – |
| fc(4) | 13.59 | – | – | – |

Labels: 3001, 3002, 3003, 3004, 3005

FIG.13

| t1 | t2 | d1 | d2 | q |
|----|----|----|----|---|
| 0  | 0  | X  | X  | * |
| 1  | 0  | d  | X  | d |
| 0  | 1  | X  | d  | d |
| 1  | 1  | d  | X  | d | d = "0" or "1"
X = don't care

F I G. 19
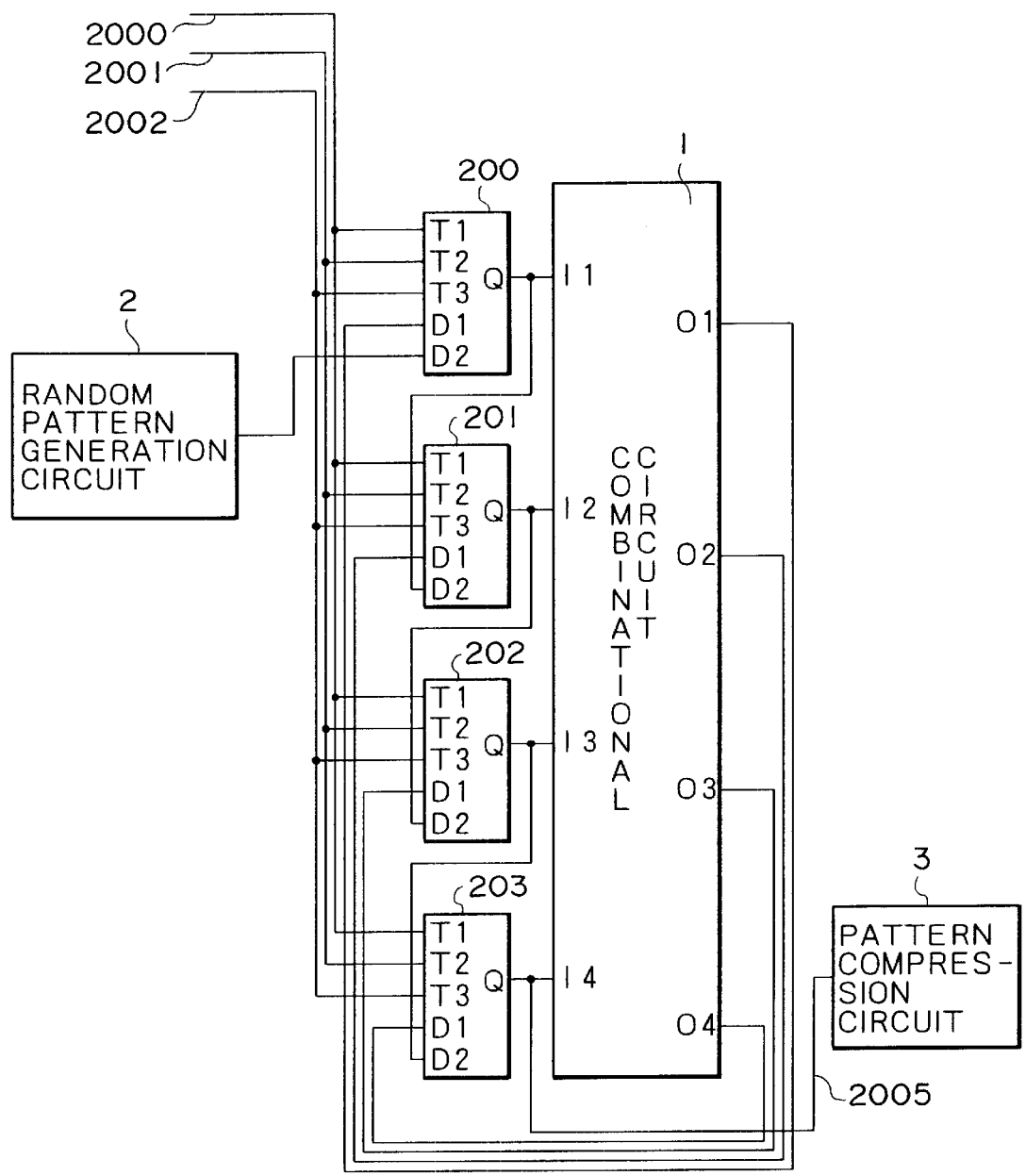

SEMICONDUCTOR INTEGRATED CIRCUIT AND METHOD OF DESIGNING THE SAME

TECHNICAL FIELD

The present invention relates to a semiconductor integrated circuit for testing logic circuits and a method for designing a circuit for performing such tests.

BACKGROUND ART

Generally, logic circuits that operate at high speeds each include an additional test circuit called a scan circuit for readily testing the logic circuit in question. Because the scan circuit runs on a scan clock, i.e., on a clock signal for testing purposes, tests cannot be conducted on a system clock (design frequency) on which the logic circuit normally operates. Tests performed by use of the system clock on which the logic circuit usually runs are called delay tests. For enhanced reliability, the delay tests must be carried out.

Japanese Patent Laid-open No. Hei 4-118570 discloses flip-flops for executing delay tests, the flip-flops being arranged to store system data in keeping with a system clock, accommodate scan data by use of a scan clock, and store scan data based on the system clock. In operation, the flip-flops are connected to an input and an output terminal of each circuit path under test. With the system clock in use, the flip-flop at the input terminal reads scan data while the flip-flop at the output terminal acquires system data in keeping with the system clock.

There exists a method for performing delay tests on the logic circuit through the use of not a specifically added circuit but function test patterns that have been created using a string of operating instructions. The method involves having the function test patterns entered through external input pins of the logic circuit to get the logic circuit running on the system clock, before output patterns are acquired through output pins of the circuit. Delay tests are carried out by making comparisons between output patterns obtained beforehand through logic simulations or the like on the one hand, and patterns that are output when the logic circuit in question is operated on the other hand.

The above-cited known techniques have the following major problems:

First of all, there is a lack of consideration for arranging the flip-flops in a manner suitable for performing the delay tests discussed in the publication. To execute the delay tests requires using flip-flops capable of storing system data in keeping with the system clock, retaining scan data based on the scan clock, and accommodating scan data by use of the system clock. Such flip-flop arrangements tend to have a large scale of circuitry. If the flip-flops are connected to all input and output terminals of the circuit under test, the whole circuit area will become inordinately large.

As a second disadvantage, the flip-flops must be initialized using the scan clock, scan data must be input to the paths under test, and the results of having passed data through the paths under test must be acquired before the delay tests can be conducted. The scan clock and system clock must be switched during a single system clock cycle by use of a switching signal. If the circuit under test is large enough in scale and if flip-flops are connected to all paths to be tested, delays in the propagation of the switching signal can prevent the system clock and scan clock from getting switched during the single clock cycle. The clock switchover can also be thwarted if the clock period is sufficiently short.

It is therefore an object of the present invention to overcome the above and other deficiencies of the prior art and to provide a semiconductor integrated circuit capable of permitting delay tests while minimizing any increase in its circuit area. It is another object of the invention to provide a semiconductor integrated circuit allowing highly accurate delay tests to be carried out.

DISCLOSURE OF INVENTION

In achieving the foregoing and other objects of the present invention and according to one aspect thereof, there is provided a semiconductor integrated circuit constituted by a logic circuit made of logic elements, by scanning function-equipped storage elements, and delay test-ready scanning function-equipped storage elements. The scanning function-equipped storage elements store system data based on a system clock and retain scan data in keeping with a scan clock. The delay test-ready scanning function-equipped storage elements store system data by use of the system clock and accommodate scan data based on the scan clock or system clock. When the semiconductor integrated circuit includes the scanning function-equipped storage elements and the delay test-ready scanning function-equipped storage elements, the logic circuit is tested on the basis of the system clock with a reduced number of delay test-ready scanning function-equipped storage elements. This structure helps prevent the circuit area from expanding.

According to another aspect of the invention, there is provided a semiconductor integrated circuit constituted by a logic circuit made of logic elements and by delay test-ready scanning function-equipped storage elements capable of internally switching a system clock and a scan clock for storing scan data. When the system clock and scan clock are internally switched, there is no need to have a switching signal input from the outside; hence no need for the conventional switching signal wiring. This makes it unnecessary to consider delay times of switching signal propagation in the presence of a plurality of delay test-ready scanning function-equipped storage elements. This structure allows highly accurate tests to be conducted while preventing the circuit area from getting larger.

According to a further aspect of the invention, there is provided a method for designing a semiconductor integrated circuit constituted by a logic circuit made of a plurality of logic elements and by a plurality of scanning function-equipped storage elements, wherein the likelihood of a transition signal occurring on an output signal line of each scanning function-equipped storage element is obtained every time a system clock signal is applied to the scanning function-equipped storage element in question, the obtained likelihood being used as a basis for determining which of the plurality of scanning function-equipped storage devices may be changed.

In one preferred variation of the semiconductor designing method according to the invention, the changeable scanning function-equipped storage elements may be utilized as delay test-ready scanning function-equipped storage elements constituting a semiconductor integrated circuit. When this preferred method is adopted, there is no need to assign the delay test-ready scanning function-equipped storage elements to all outputs of the logic circuit. This helps prevent the circuit area from expanding.

In another preferred variation of the semiconductor designing method according to the invention, the number of changeable scanning function-equipped storage elements may be varied as desired or depending on the rate of error detection. When this preferred method is employed, the exact number of delay test-ready scanning function-equipped storage elements may be determined as required by the designer for the tests involved.

In a further preferred variation of the semiconductor designing method according to the invention, circuit data may be output to represent delay test-ready scanning function-equipped storage elements, scanning function-equipped storage elements and a logic circuit which constitute a semiconductor integrated circuit designed by the method. Using the output circuit data, other designers may also design semiconductor integrated circuits that have a reduced circuit area.

BRIEF DESCRIPTION OF DRAWINGS

FIG. 1 is a schematic view showing how to select delay test-ready scanning function-equipped storage elements.

FIG. 3 is a tabular view listing computational rules applicable to basic elements.

FIG. 8 is a tabular view listing first clock cycle controllability parameters for each of the signal lines of the circuit in FIG. 6.

FIG. 9 is a tabular view listing parameters of the first and second clock cycle controllability, rise signal occurrence probability, second clock cycle observability, rise failure detection probability, and fall failure detection probability for each of the signal lines of the circuit in FIG. 6.

FIG. 10 is a tabular view used to explain steps constituting the method for selecting ACSFF's with the circuit in FIG. 6.

FIG. 13 is a schematic view showing flip-flop (FF) operations.

FIG. 19 is a block diagram of another logic circuit to which delay test-ready scanning function-equipped storage elements (ACSFF) are applied.

BEST MODE FOR CARRYING OUT THE INVENTION

Figure 2A:
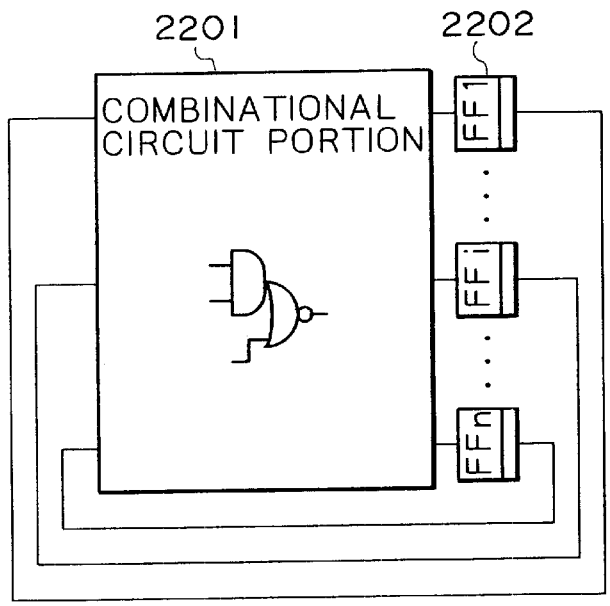
FIGS. 2A and 2B are schematic views depicting circuit models by which to compute parameters used for selecting storage elements.

The best mode for carrying out the invention will now be described with reference to the accompanying drawings.

A semiconductor integrated circuit practiced as an embodiment of this invention at least comprises: a logic circuit made of logic elements, scanning function-equipped storage elements, delay test-ready scanning function-equipped storage elements or logic circuits, and delay test-ready scanning function-equipped storage elements. The scanning function-equipped storage elements store system data on the logic circuit in keeping with a system clock, i.e., a design frequency for the logic circuit, and accommodate scan data for tests by use of a scan clock, a testing frequency. The delay test-ready scanning function-equipped storage devices store system data in keeping with the system clock, hold scan data based on the scan clock, and accommodate scan data by use of the system clock. The scanning function-equipped storage elements and delay test-ready scanning function-equipped storage elements will be described later in terms of circuit structures. In the description that follows, the scanning function-equipped storage elements are represented by SFF's, the delay test-ready scanning function-equipped storage elements by ACSFF's, and the scanning function equipped storage elements as well as delay test-ready scanning function-equipped storage elements by storage elements generically or by FF's.

Below is a description of a method for designing a semiconductor integrated circuit conducive to preventing its circuit area from expanding. This semiconductor designing method involves selecting storage elements for determining the layout of ACSFF's needed for delay tests. The storage element selecting method is described below. FIG. 1 shows a structure of an apparatus designed to implement the method for selecting storage elements. In FIG. 1, an ACSFF pointer 2103 receives circuit data 2101 including circuit connection information as well as parameters 2102 regarding FF selection conditions, and outputs a set 2104 of ACSFF's, i.e., a set of FF's to be used as ACSFF's. The ACSFF pointer 2103 generates the set of ACSFF's by computing the probabilities of transition signal occurrences on all FF output signal lines and by selecting FF's based on the probability of transition signal occurrences of each FF and in keeping with the FF selection conditions designated by the parameters 2102.

The transition signal refers generically to a rise and a fall signal, and the probability of transition signal occurrences denotes generically the probability of occurrences of a rise or a fall signal. The probabilities of transition signal occurrences on the FF output signal lines are computed by the ACSFF pointer 2103 in several ways. In addition to a probability computing procedure to be described later in detail, there is illustratively a method of inputting a large number of patterns to the logic circuit and counting the number of times a transition signal occurs on each of the FF output signal lines, whereby signal occurrence probabilities are statistically computed. FF's are selected on the basis of transition signal occurrence probabilities and parameters in a number of ways. Besides a selecting procedure to be described later in detail, there is illustratively a method of arranging in ascending order minimum values of the probabilities of rise and fall signal occurrences on FF's and selecting as many FF's in descending order of their probabilities as designated by the parameters 2102. There is also a method of selecting FF's whose probabilities of transition signal occurrences are below those designated by the parameters 2102.

Described below is a concept of how to select FF's. FIG. 2A depicts a basic structure for performing delay tests on a logic circuit, and FIG. 2B shows a model by which to compute indicators for selecting FF's.

FIG. 2A shows a logic circuit model having storage elements. The model includes a combinational circuit portion 2201 constituting a logic circuit and a storage element group 2202 made up of storage elements FF1 through FFn. The combinational circuit portion 2201 has no storage elements and comprises such elements as NOT's, AND's and OR's, external inputs, external outputs, and signal lines for connecting these components. The storage elements FF1 through FFn are all SFF's that have a scanning function for test purposes. The circuit shown in FIG. 2A acts as a sequential circuit in which the external output of the next clock cycle and the internal state of storage elements are dependent in normal operation on the external input and on the internal state of the storage elements.

Figure 2B:
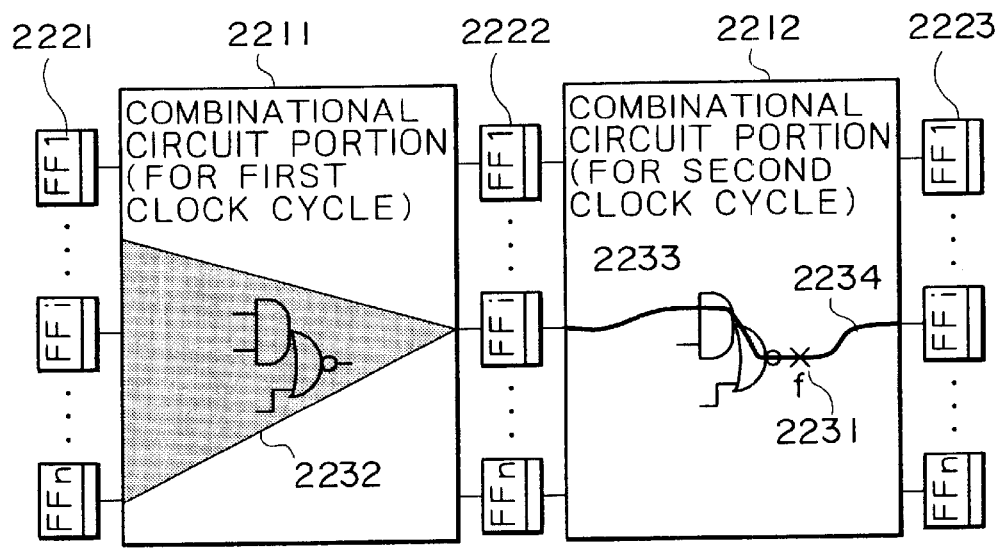

FIG. 2B shows a combinational circuit formed by having the logic circuit of FIG. 2A expanded on two time bases. The circuit of FIG. 2B is a model that imitates the workings of the logic circuit in FIG. 2A with its scanning function activated. Combinational circuit portions 2211 and 2212 in FIG. 2B are structurally identical to the combinational circuit portion 2201 of FIG. 2A, the portions 2211 and 2212 corresponding to a first and a second clock cycle respectively. Storage element groups 2221, 2222 and 2223 are identical in structure to the storage element group 2202 in FIG. 2A. The group 2221 comprises FF's whose scan data are input to the combinational circuit portion 2211 upon application of a first scan clock signal. The group 2222 includes FF's which acquire system data upon application of a system clock signal in the first cycle and which forward the data to the combinational circuit portion 2212. The group 2223 contains FF's that capture the system data upon application of the system clock signal in the second cycle.

As failure models, there may be assumed a gate transition failure that prevents a transition signal from propagating over a signal line, and a gate delay failure that causes a transition signal to delay over a signal line. In the description that follows, the transition failure alone will be discussed because the transition failure and delay failure come to the same thing with this embodiment of the invention. Explained below is a case where a gate transition failure "f" is detected as indicated by reference numeral 2231 in FIG. 2B. When logic values set by the FF's of the storage element group 2221 pass through a region 2232 in the combinational circuit portion 2211 to reach FFi in the storage element group 2222, the logic value of FF1 in the storage element group 2221 may or may not coincide with the logic value of FFi in the storage element group 2222. In the case of a mismatch between the two logic values, a transition signal is recognized to have occurred at FFi. If the transition signal propagates onto a path 2233, the transition failure 2231 is activated. On a path 2234, however, propagates a signal denoting the difference between a normal and an abnormal state due to the transition failure. The transition failure is eventually observed at one of the FF's in the storage element group 2223.

Below is a description of definitions and characteristics of the time base-expanded circuit model and the failure model necessary for selecting FF's.

When random patterns are set by SFF's, the probability of a signal line "i" having a logical 0 is defined as zero-controllability; the probability of the signal line "i" having a logical 1 is defined as one-controllability; and the probability of the signal line "i" having a failure signal (a signal of difference between normal and abnormal state) observed at one of the SFF's is defined as observability. For the combinational circuit portion 2211 in the first clock cycle, the zero-controllability, one-controllability and observability of the signal line "i" are denoted by $C0(2, i)$, $C1(2, i)$ and $O(i)$, respectively. For the FF's, the output signal line of the storage element group 2221 and the input signal line of the storage element group 2222 are treated as applicable to the first clock cycle, while the output signal line of the storage element group 2222 and the input signal line of the storage element group 2223 are handled as applicable to the second clock cycle. The probabilities of a rise signal and a fall signal occurring on the signal line "i" are called the rise signal occurrence probability and the fall signal occurrence probability respectively, and denoted by $TR(i)$ and $TF(i)$. The probability of the signal line "i" having a logical 0 in both the first and the second clock cycle is defined as the steady zero probability and denoted by $T0(i)$; the probability of the signal line "i" having a logical 1 in both the first and the second clock cycle is defined as steady one probability and represented by $T1(i)$. The constant zero and constant one probabilities embrace signal values at which hazards may occur.

Of the above-defined probabilities, eight probabilities except for $O(i)$ have their characteristics clearly expressed by expressions (1) through (6) below:

$$C0(1, i)+C1(1, i)=1 \tag{1}$$

$$C0(1, i)+C1(1, i)=1 \tag{2}$$

$$T0(i)+TR(i)=C0(1, i) \tag{3}$$

$$T0(i)+TF(i)=C0(2, i) \tag{4}$$

$$T1(i)+TR(i)=C1(2, i) \tag{5}$$

$$T1(i)+TF(i)=C1(1, i) \tag{6}$$

$$C0(1, i)=1-C1(1, i) \tag{7}$$

$$C0(2, i)=1-C1(2, i) \tag{8}$$

Of the above expressions, expressions (1) and (2) are derived from the fact that any signal line in the first or the second clock cycle has a logical 0 or 1. Expression (3) is based on the fact that either a steady zero probability signal or a rise signal has a logical 0 in the first clock cycle, and so are expressions (4) through (6). Expressions (1) through (6) are modified into expressions (7) through (11).

$$T0(i)=1-C1(1, i)-TR(i) \tag{9}$$

$$T1(i)=C1(2, i)-TR(i) \tag{10}$$

$$TF(i)=C1(1, i)-C1(2, i)+TR(i) \tag{11}$$

Because all probabilities defined above are expressed by use of $C1(1, i)$, $C1(2, i)$, $TR(i)$ and $O(i)$ as indicated, establishing a method for computing these four probabilities makes it possible to acquire all probabilities above.

FIG. 3 lists computational rules regarding $C1(1, i)$, $C1(2, i)$, $TR(i)$ and $O(i)$. The leftmost column in the tabular view indicates basic elements representing NOT, AND, OR, EOR, branch, SFF and ACSFF, arranged from the top. Computational rules for all other elements are derived from combinations of the basic elements. Illustratively, the probability of $C1(1, i)$ is computed on each of all signal lines of the storage element groups 2221 and combinational circuit portion 2211 starting from the input side to the output side, by referring to the second column from the left in FIG. 3. Computations about $C1(2, i)$ presuppose that the probability of $C1(1, i)$ has been computed already. The probability of $C1(2, i)$ is computed on each of all signal lines of the storage element groups 2222 and combinational circuit portion 2212 starting from the input side to the output side, by referring to the second column from the left in FIG. 3. Computations about TR(i) presuppose that the probabilities of C1(1, i), C1(2, i), and TR(i) on the SFF output signal line of the storage element group 2222 (to be described later) have already been computed. The probability of TR(i) is then computed on each of all signal lines of the storage element groups 2222 and combinational circuit portion 2212 starting from the input side to the output side, by referring to the third column from the left in FIG. 3. Computations about O(i) presuppose that the probability of C1(2, i) has been computed already. The probability of O(i) is then computed on each of all signal lines of the storage element groups 2222 and combinational circuit portion 2212 starting from the output side to the input side, by referring to the fourth column from the left in FIG. 3. Expressions (7) through (11) are used as needed for computations by reference to FIG. 3.

With the above probabilities computed, an estimated rate of transition failure detection and other related rates are defined below. If a rise failure of a signal line "i" is represented by i/R, the probability of rise failure detection DP(i/R) is defined as $$DP(i/R)=TR(i) \times O(i) \quad (12)$$

The probability of rise failure detection signifies how probable it is for a rise failure to be detected when a single random pattern is input. Expression (12) is defined on the assumption that a rise signal occurs on the signal line "i" and that a failure signal generated over the signal line "i" can be observed. Likewise, if a fall failure of the signal line "i" is represented by i/F, the probability of fall failure detection DP(i/F) is defined by expression (13) below. Furthermore, an estimated rate FC(N) of detecting a transition (delay) failure upon input of N random patterns is defined by expression (14), and an estimated number U(N) of undetected transition failures is defined by expression (15) below:

$$DP(i/F)=TF(i) \times O(i) \quad (13)$$

$$FC(N) = 100 \times \frac{1}{|F|} \times \sum_{f \in F} (1 - (1 - DP(f))^N) \quad (14)$$

$$U(N) = \sum_{f \in F} (1 - DP(f))^N \quad (15)$$

where, F stands for a set of assumed transition failures, f for the elements involved, and F for an assumed number of transition failures. In practice, the estimated rate of transition failure detection FC(N) and the estimated number of undetected failures U(N), both obtained upon application of random patterns as part of built-in self-tests (BIST), are considered to be sufficiently accurate. In the description that follows, the estimated rate of transition (delay) failure detection is simply called the estimated detection rate.

The processing of the ACSFF pointer 2103 shown in FIG. 1 will now be described on the basis of the above-described definitions and characteristics.

Figure 4:
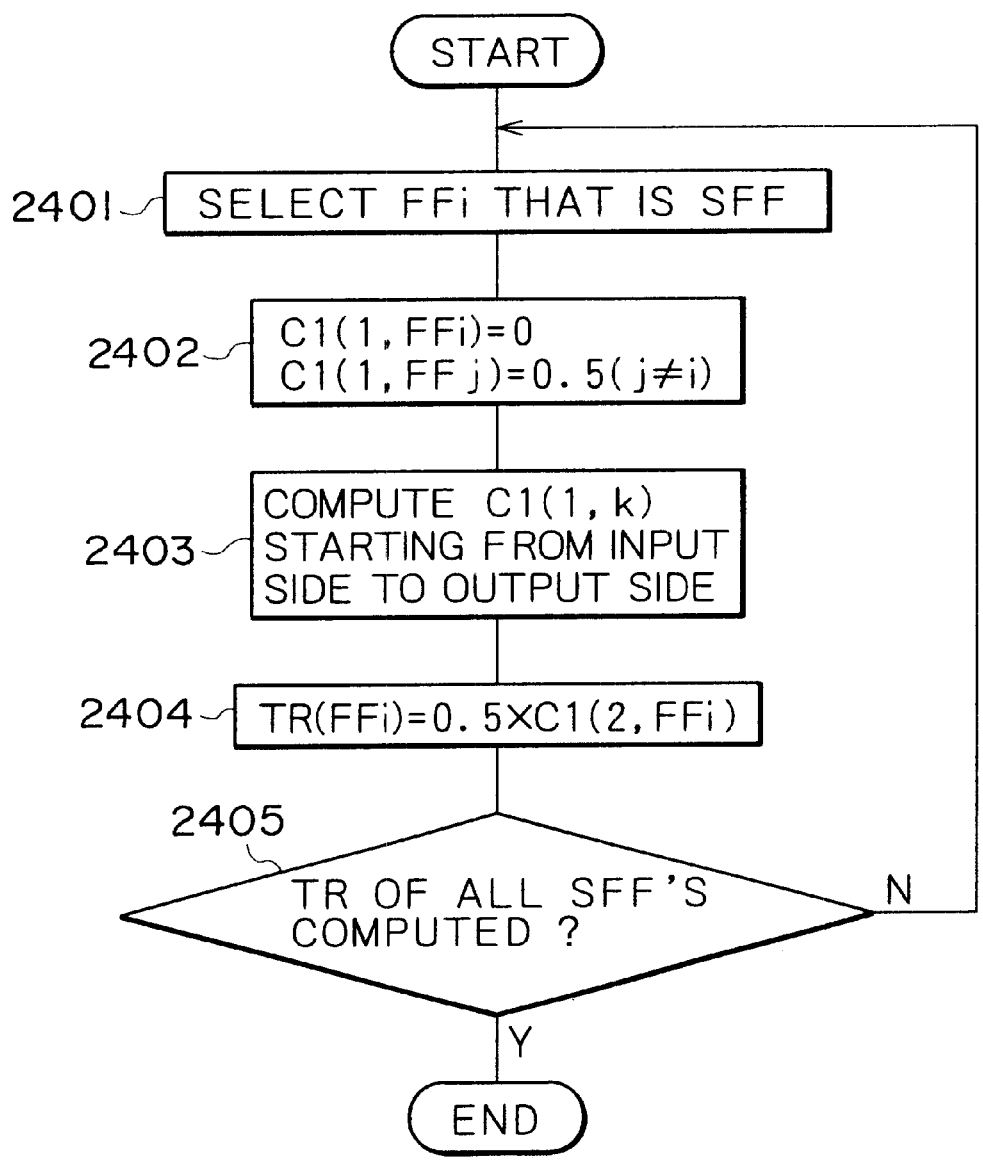
FIG. 4 is a flowchart of steps constituting a procedure for computing the probability of signal occurrences.

FIG. 4 is a flowchart of steps constituting a process in which the ACSFF pointer 2103 computes the probability of transition signal occurrences at all FF's. For the process, it is assumed that the output of FFi in the first clock cycle is fixed to a logical 0 while logical 0's and 1's are randomly output for the other FF's. On that assumption, the process involves obtaining initially a probability such that the output of FFi in the second clock cycle becomes a logical 1. The probability thus acquired is multiplied by half the probability (0.5) of the output FFi becoming a logical 0 in the first clock cycle, whereby the transition signal occurrence probability is obtained. More specifically, FFi is selected as an SFF in step 2401. In step 2402, the one-controllability in the first clock cycle is set as zero for FFi and as 0.5 for the FF's other than FFi. In step 2403, the one-controllability in the first clock cycle is computed in accordance with the computational rules in the second column from the left in FIG. 3 starting from the input side to the output side. In step 2404, the one-controllability in the second clock cycle for FFi is computed based on its input, and the computed result is multiplied by 0.5 to acquire the rise signal occurrence probability on the FFi output signal line. In a simple FF setup, the one-controllability computed in the second clock cycle is the same as that on the system data line; in an FF setup having set and reset functions or the like, the additional features should be taken into account in probability computations. In step 2405, a check is made to see if the rise signal occurrence probabilities of the output signal lines for all SFF's have been computed. If the result of the check is negative, step 2401 is reached again, until the rise signal occurrence probabilities on the output signal lines have been computed for all SFF's.

The process above constitutes a procedure for computing the rise signal occurrence probabilities on the SFF output signal lines. The fall signal occurrence probabilities on the same lines may be computed by use of expression (11) above. The steps for finding the fall signal occurrence probabilities are the same as those described above.

Figure 5:
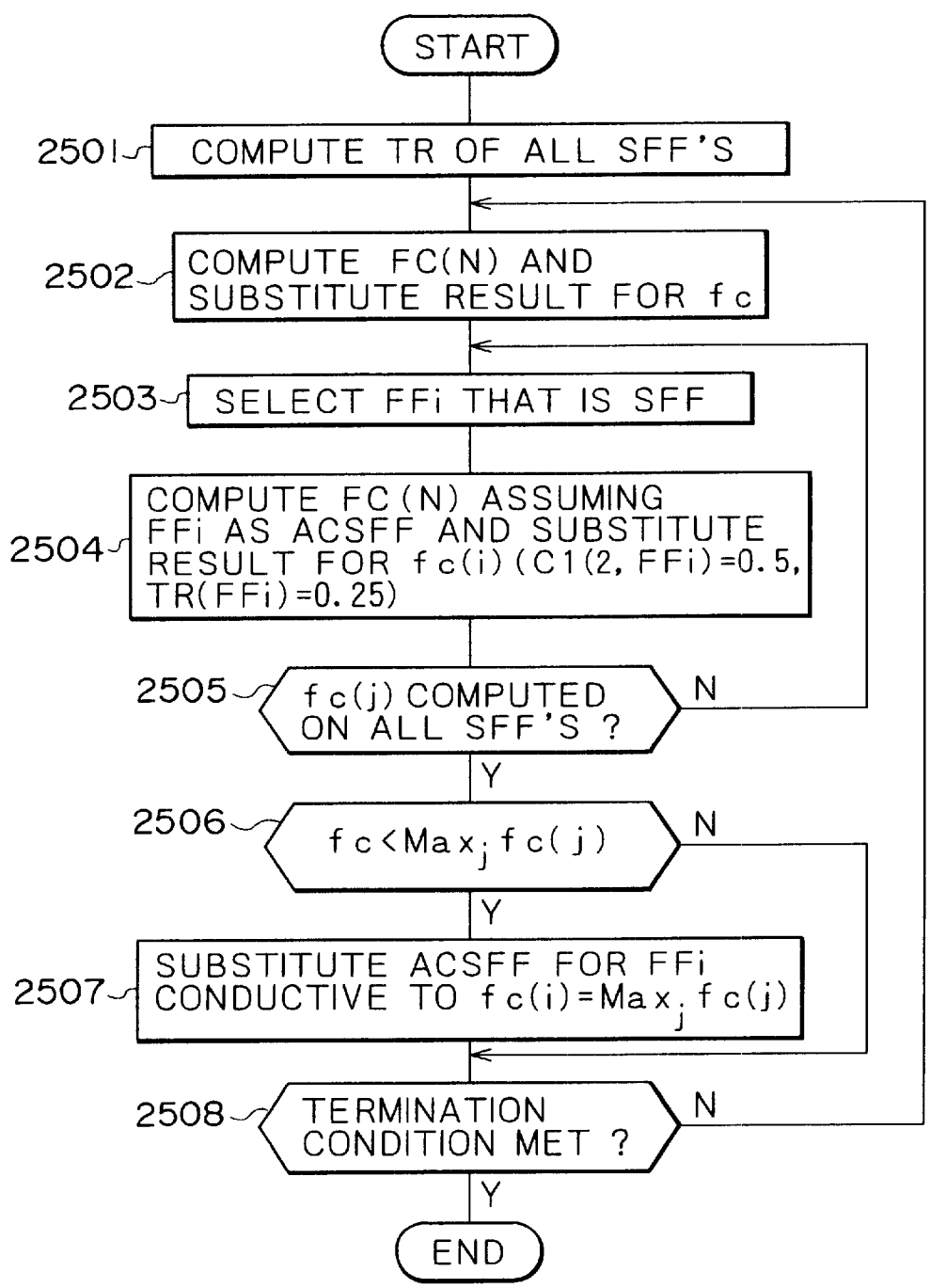
FIG. 5 is a flowchart of steps constituting a method for selecting ACSFF's.

FIG. 5 is a flowchart of steps constituting a process in which the ACSFF pointer 2103 selects FF's based on transition signal occurrence probabilities and in accordance with parameters. In step 2501, the rise signal occurrence probabilities for all SFF output signal lines are computed. In step 2502, the one-controllability in the first and the second clock cycle, the observability in the second clock cycle, and the rise signal occurrence probabilities are computed on all signal lines. Thereafter the estimated detection rate FC(N) is computed by use of expression (14) and the result is substituted for fc. In steps 2503 through 2505, the estimated detection rate for each SFF is computed on the assumption that the SFF in question is replaced by an ACSFF. In computing the estimated detection rates, it is assumed that the one-controllability in the second clock cycle for the FFi output signal line is 0.5 and that the rise signal occurrence probability for the same signal line is 0.5. On this assumption, the one-controllability in the second clock cycle, rise signal occurrence probability, and observability in the second clock cycle for FFi are computed. The value obtained by use of expression (14) is substituted for fc(i). In step 2506, a check is made to see if replacing one of the SFF's with an ACSFF enhances the estimated detection rate. If the result of the check in step 2506 is affirmative, step 2507 is reached in which the SFF is replaced by the ACSFF conducive to maximizing the estimated detection rate. If in step 2506 it is found that replacing any SFF with an ACSFF does not improve the estimated detection rate or if step 2507 is carried out, then a check is made in step 2508 to see if a termination condition is met. If the termination condition is found to be met, the process is brought to an end. If the termination condition is not met, step 2502 is reached again. The termination condition may be any one of the number of SFF's to be replaced by ACSFF's, a specific condition for determining the estimated detection rate, the absence of switchover to any ACSFF for improving the estimated detection rate, and others. These conditions are provided by the parameters 2102.

Figure 6:
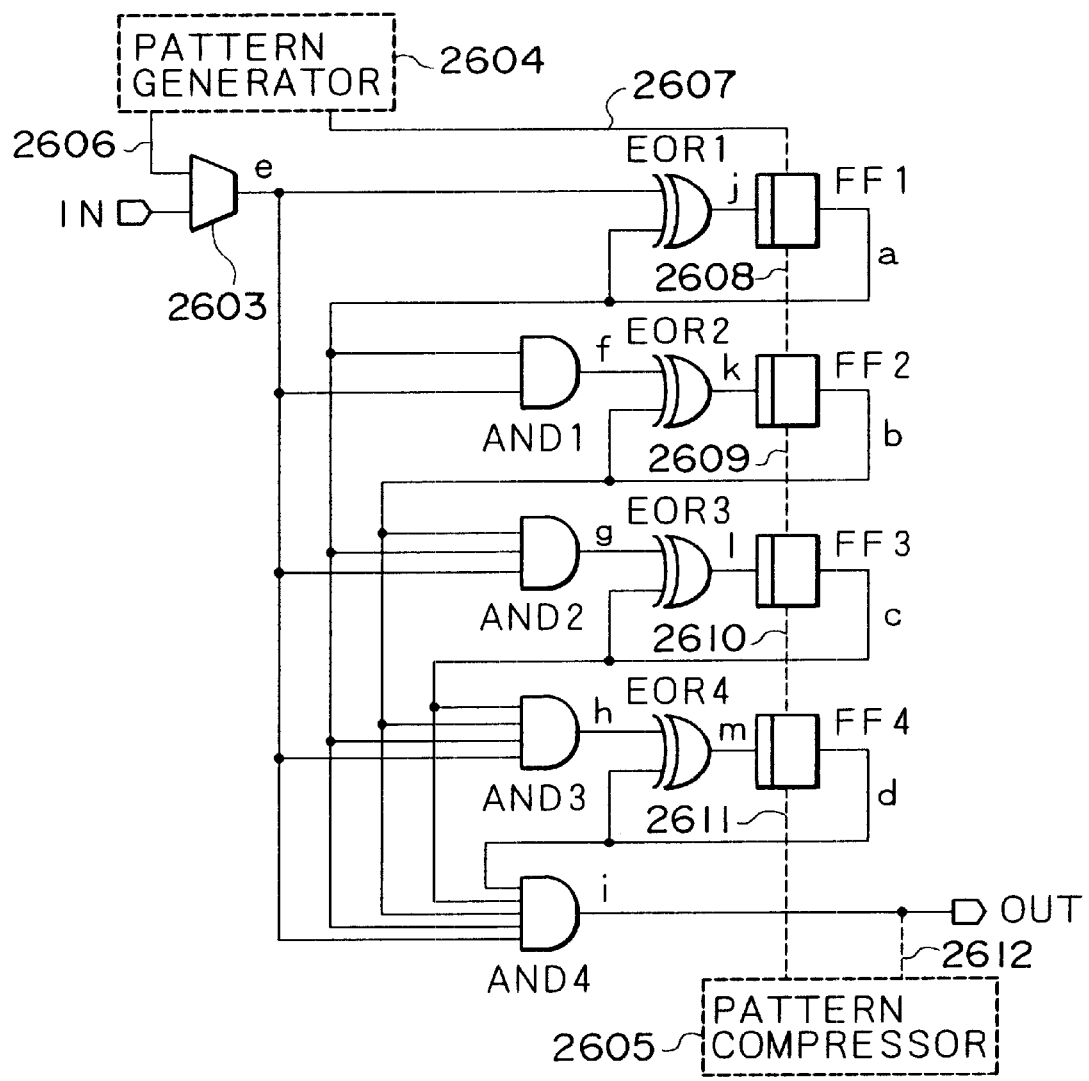
FIG. 6 is a circuit diagram of a circuit used to explain the method for selecting ACSFF's.

Below is a description of what takes place when the above-described process is applied to a circuit shown in FIG. 6. FIG. 6 is a circuit diagram of a four-bit binary counter with one input and one output. An external input IN and an external output OUT represent an enable and a carry of the binary counter respectively. Storage elements FF1, FF2, FF3 and FF4 denote respectively 20 bits, 21 bits, 22 bits and 23 bits on the boundary counter. The storage elements are SFF's which operate in synchronism with a system clock and which perform scanning during tests. For purpose of simplicity, system clock wiring is not shown in FIG. 6. In operation, an input of a system clock signal increments by 1 the binary counter whose external input IN is set for a logical 1. For such an operation to be performed, the circuit of FIG. 6 has AND gates AND1, AND2, AND3 and AND4, as well as EOR gates EOR1, EOR2, EOR3 and EOR4 connected inside. For test purposes, the circuit is supplemented with a pattern generator 2604, a selector 2603 for switchover between the external input IN and a signal from the pattern generator, a signal line 2606 for connecting the external input IN to the pattern generator 2604; scan chains 2607, 2608, 2609, 2610 and 2611 for setting signals from the pattern generator 2604 to the storage elements FF1, FF2, FF3 and FF4; and a pattern compressor 2612 for compressing the signals coming from the scan chains. The signal lines are identified by signal line names "a" through "m" in FIG. 6.

Figure 7:
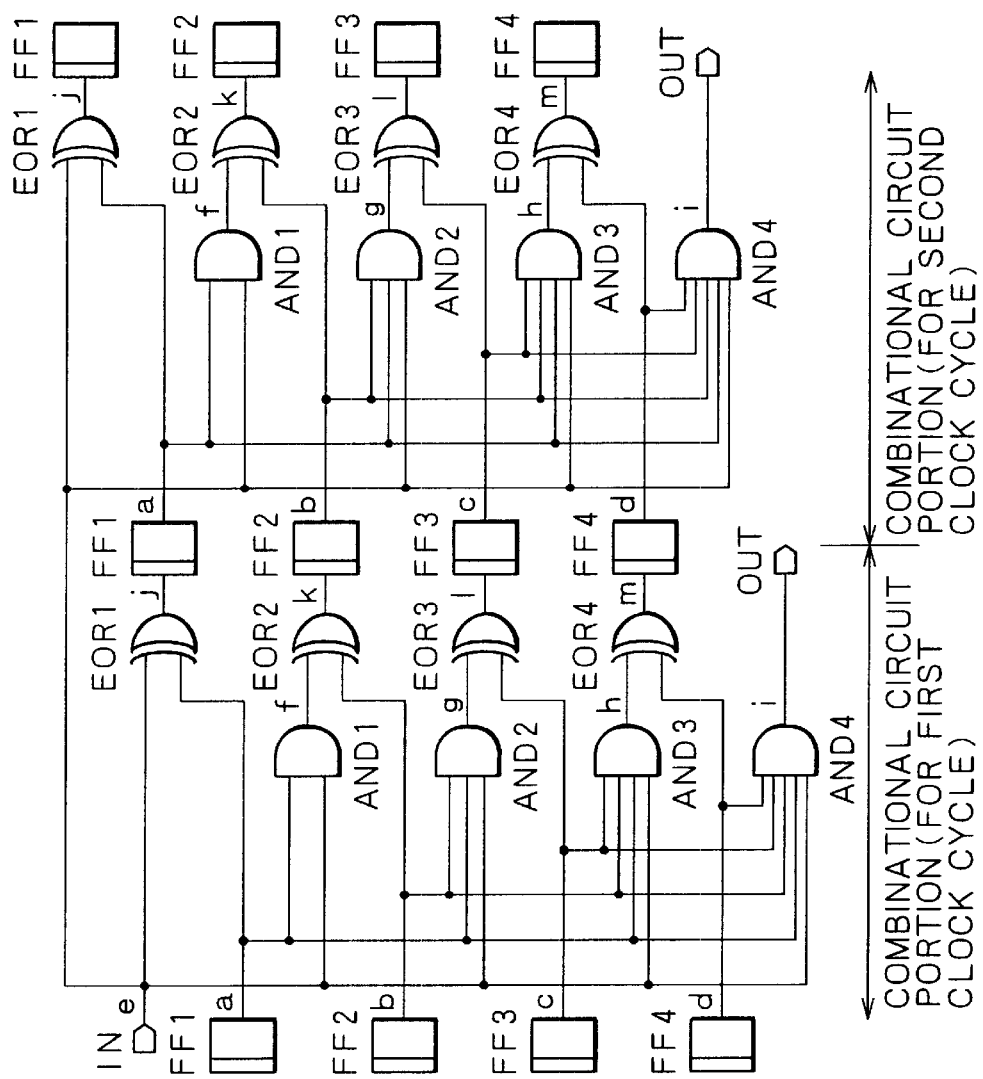
FIG. 7 is a circuit diagram of a circuit in which the circuit of Fit. 6 is expanded on two time bases.

FIG. 7 is a circuit diagram of a circuit in which the logic circuit of Fit. 6 is expanded on two time bases. This circuit corresponds to the time base-expanded circuit model discussed in connection with FIG. 22B. The signal line "e" from the external input is regarded as common to the first and the second clock cycle because the signal value is the same in the two clock cycles.

Described below with reference to the flowchart of FIG. 4 and to FIG. 8 is how to compute the rise signal occurrence probability TR on each of the output signal lines "a," "b," "c" and "d" of the storage elements FF1, FF2, FF3 and FF4. With FF1 selected in step 2404 of FIG. 4, the computations of controllabilities in the first clock cycle in steps 2402 and 2403 take place as shown in a column 2802 of FIG. 8. Specifically, it is established that C1(1, a)=0, C1(1, b)=0.5, C1(1, c)=0.5 and C1(1, d)=0.5, and the controllabilities in the first clock cycle are computed starting from the input side to the output side in accordance with the computational rules given in FIG. 3. In step 2404, because C1(1, j)=C1(2, a), the rise signal occurrence probability on the output signal line "a" for the storage element FF1 is computed as $$TR(a)=0.5 \times C1(2, a)=0.5 \times 0.5=0.25$$

Repeating the check in step 2405 permits computations of the rise signal occurrence probabilities TR(b), TR(c) and TR(d) on the output signal lines "b," "c" and "d" for the storage elements FF2, FF3 and FF4 in like manner as shown in columns 2803, 2804 and 2805 of FIG. 8. The results of the computations are listed in a column 2904 of FIG. 9 with respect to the signal lines "a," "b," "c" and "d."

Described below with reference to the flowchart of FIG. 5 as well as to FIGS. 9 and 10 is how to select any one of the storage elements FF1, FF2, FF3 and FF4 for replacement by an ACSFF. It is assumed here that the number N of random patterns is 1 and that the termination condition is considered to be met when no ACSFF is selectable for improving the estimated detection rate.

Step 2501 is first performed as described earlier. In step 2502, the controllabilities in the first and the second clock cycle are computed on the signal lines "a," "b," "c," "d," "e," "f," "g," "h," "i," "j," "k," "l" and "m," in that order; the rise signal occurrence probabilities are computed on the signal lines "e," "f," "g," "h," "i," "j," "k," "l" and "m," in that order; and the observabilities in the second clock cycle are computed on the signal lines "m," "l," "k," "j," "i," "h," "g," "f," "e," "d," "c," "b" and "a," in that order. The computational rules of FIG. 3 are used for the computations. The results of the computations are listed in columns 2902, 2903, 2904 and 2905 of FIG. 9. In addition, expressions (12) and (13) are used to compute the transition (delay) failure detection rates of the rise and fall signals, and the results are shown in columns 2906 and 2907 of FIG. 9. In this case, the estimated detection rate FC(1) is found to be 10.48 by application of expression (14) and is used for fc.

In steps 2503, 2504 and 2505, estimated detection rates fc(1), fc(2), fc(3) and fc(4) are obtained for the storage elements FF1, FF2, FF3 and FF4 respectively when the FF in question is replaced by an ACSFF. Consider the storage element FF2 as an example. The settings of C1(2, b)=0.5 and TR(b)=0.25 are established by referring to the computed results in FIG. 8. After this, the controllabilities in the second clock cycle, rise signal occurrence probabilities, observability in the second clock cycle, and transition (delay ) failure detection probabilities of rise and fall signals are computed. Computations are repeated only for the signal lines on which the settings above produce a change. The estimated detection rate FC(1) is computed in the case of such a change and is used for fc(2). Likewise, fc(1), fc(3) and fc(4) are computed. The results of the computations are listed in a column 3002 of FIG. 10. From steps 2506 and 2507, it is found that the hatched fc(4) out of fc(1), fc(2), fc(3) and fc(4) is the largest. Because fc(4) is greater than fc, the corresponding storage element FF4 is replaced by an ACSFF.

The process is repeated depending on the result of the check in step 2508. After FF4 is replaced by an ACSFF, the estimated detection rates fc(1), fc(2) and fc(3) are computed with each of the storage elements FF1, FF2 and FF3 replaced by an ACSFF, and the results are shown in a column 3003 of FIG. 10. As indicated in the column 3003, FF3 is selected to be replaced by a second ACSFF. After FF4 and FF3 are replaced by ACSFF's, the estimated detection rates fc(1) and fc(2) are computed with each of the storage elements FF1 and FF2 replaced by an ACSFF, and the results are listed in a column 3004 of FIG. 10. As shown in the column 3004, FF2 is selected to be replaced by a third ACSFF. After FF4, FF3 and FF2 are replaced by ACSFF's, the estimated detection rate of fc(1) is computed with the storage element FF1 replaced by an ACSFF, and the results are shown in a column 3005. Because the results indicate that fc=fc(1), FF1 is not selected to be replaced by an ACSFF in step 2506. This terminates the process of ACSFF selection.

After the three storage elements FF2, FF3 and FF4 are replaced by ACSFF's, the estimated detection rate is improved to 17.71 from 10.48. The improved rate is equivalent to that which is in effect when all storage elements are replaced by ACSFF's. If it is assumed that the termination condition is met when two ACSFF's have been selected, then the storage elements FF3 and FF4 are replaced by ACSFF's. In that case, the estimated detection rate is 16.11, slightly inferior to what is in effect when all storage elements are replaced by ACSFF's. Still, under constraints of an area overhead (for two ACSFF's), the estimated detection rate is considered to be maximized.

The above-described semiconductor designing method based on ACSFF selection makes it possible to select SFF's to be replaced ACSFF's so as to improve efficiently transition (delay) failure detection rates. By offering such an advantage, the method helps produce a semiconductor integrated circuit capable of achieving high transition (delay) failure detection rates where the circuit area overhead is limited.

Figure 11:
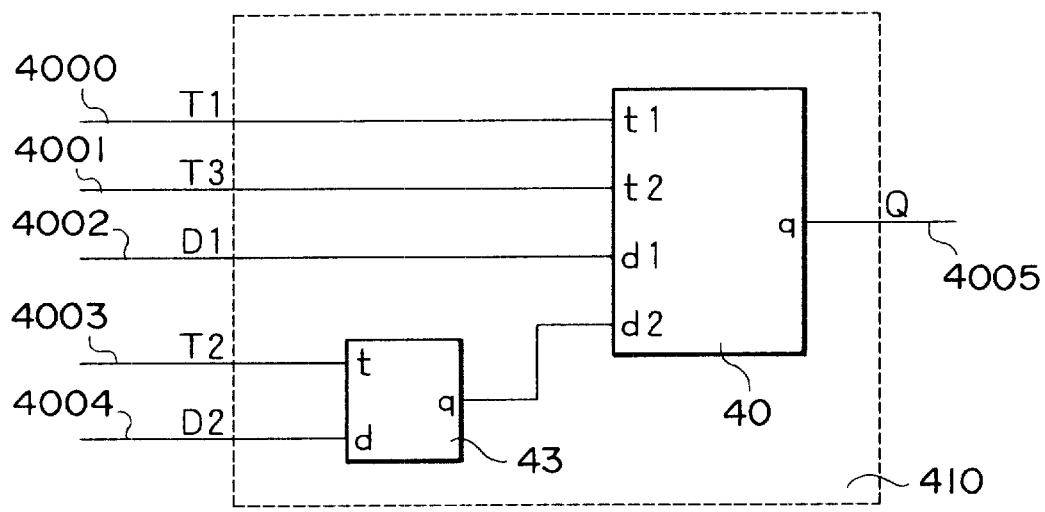
FIG. 11 is a schematic view of an SFF.

Below is a description of structures of semiconductor integrated circuits for performing delay tests on logic circuits using ACSFF's and SFF's, as well as ways to perform the tests. FIG. 11 shows a typical structure of an SFF. In FIG. 11, reference numeral 40 stands for an edge trigger type storage element, and 43 for a delay type storage element. For purpose of simplicity, the edge trigger type storage element will be referred to as an EFF and the delay type storage element as an DFF in the description that follows. FIG. 13 shows EFF operations.

In normal operation, the SFF receives data from a system-ready data pin D1 4002 in keeping with a signal 4000 on a system-ready clock pin T1, and sets the received data to the EFF. In test operation, the SFF receives data from a scan-ready data pin D2 4004 in accordance with a signal 4003 on a first scan-ready clock pin T2, sets the receive data temporarily to the DFF 43 inside, and sets the data from within the DFF to the EFF 40 in keeping with a signal 4001 on a second scan-ready clock pin T3. Two-phase signals of different phases are utilized as the first and the second scan clock signal. Setting the scan data temporarily to the DFF 43 by use of two-phase clock signals prevents the data from passing through unchecked at the time of scan data setting.

Figure 12:
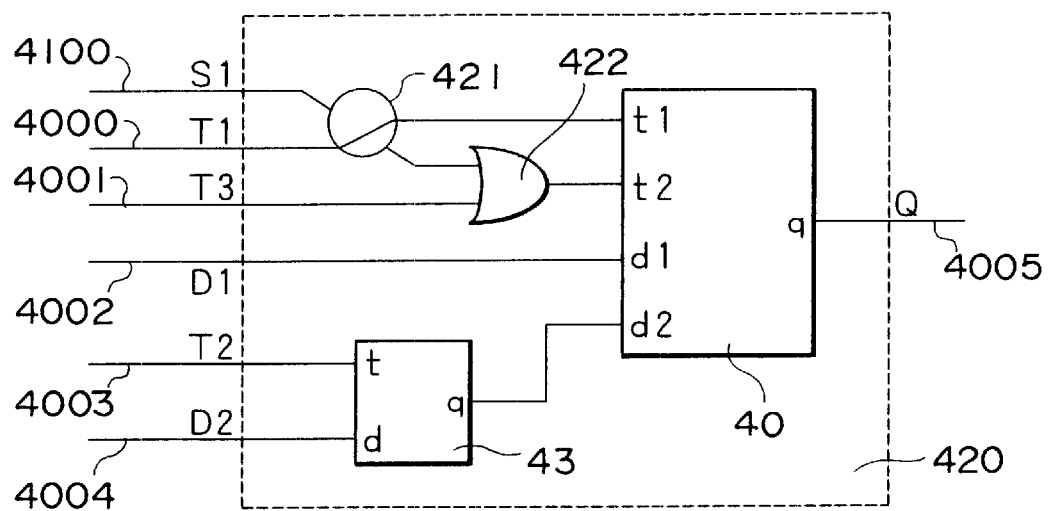
FIG. 12 is a schematic view of an ACSFF.

FIG. 12 depicts a typical structure of an ACSFF. In FIG. 12, reference numeral 40 stands for an EFF, 43 for a DFF, 421 for a switching circuit, and 422 for an OR circuit.

The ACSFF changes its operation depending on the status of a switching control signal S1 4100. Regardless of the status of the switching control signal S1 4100, the ACSFF sets data 4004 through a scan-ready data pin D2 temporarily to the DFF 43 inside, and sets the data from within the DFF 43 to the EFF 40 in accordance with a signal 4001 on a second scan-ready clock pin T3. If the switching control signal SI 4100 turns out to be on, the ACSFF sets data 4002 through a system-ready data pin D1 to the EFF 40 in keeping with the signal 4001 on the system-ready clock pin T1. If the switching control signal S1 4100 is found to be off, the ACSFF sets the data from within the DFF43 to the EFF40 in accordance with the signal 4001 on the system-ready clock pin T1. Two-phase clock signals of different phases are utilized as the first and the second scan clock signal. Setting the scan data temporarily to the DFF 43 based on two-phase clock signals prevents the data from passing through unchecked at the time of scan data setting.

Figure 14:
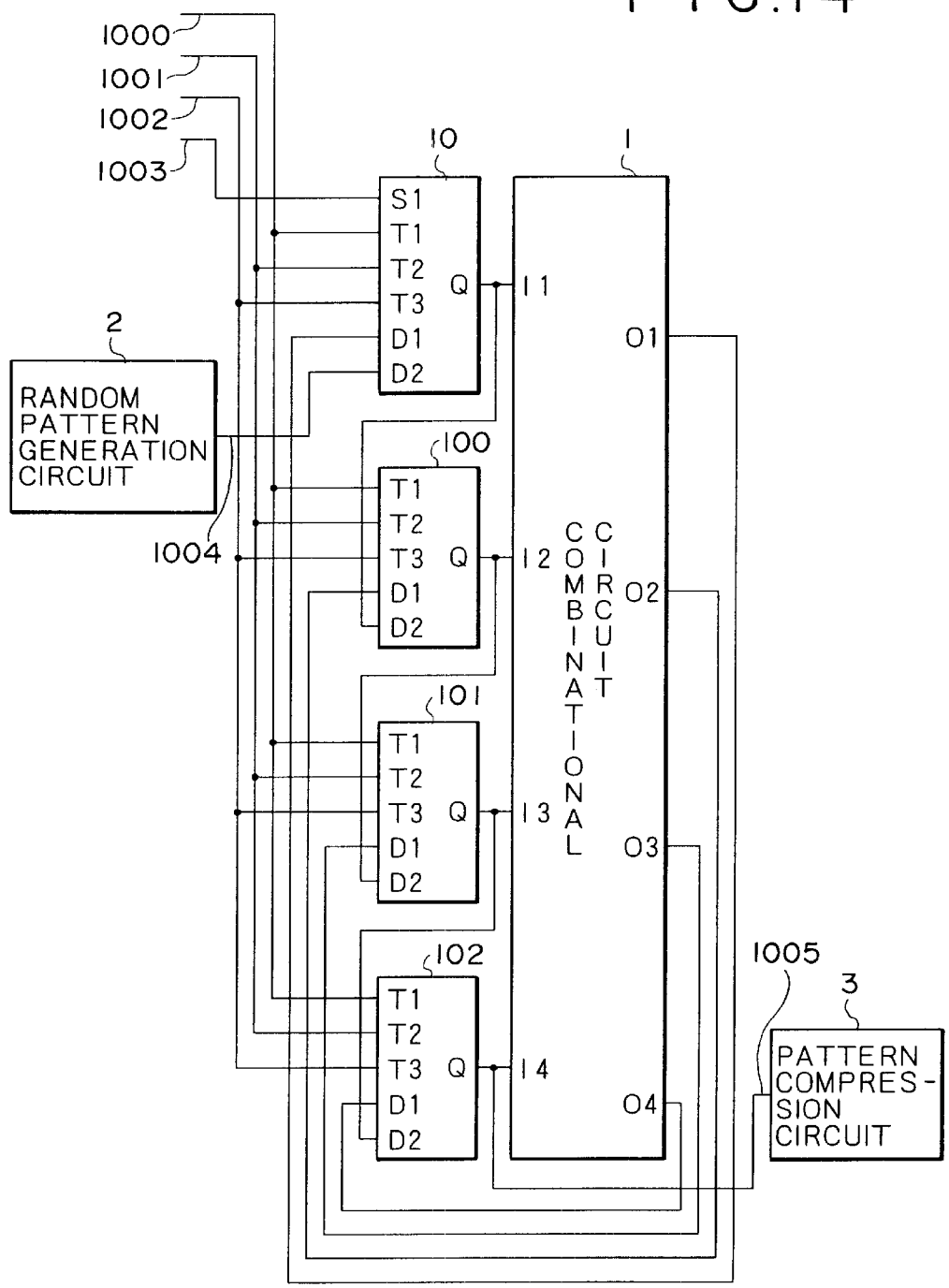
FIG. 14 is a block diagram of a logic circuit to which scanning function-equipped storage elements (SFF) and delay test-ready scanning function-equipped storage elements (ACSFF) are applied.

FIG. 14 is a block diagram of a semiconductor integrated circuit formed by having an ACSFF introduced into an SFF-equipped circuit in accordance with transition probabilities on a system data signal line. In FIG. 14, reference numeral 1 stands for a combinational circuit portion, 2 for a random pattern generation circuit, 3 for a pattern compression circuit, 10 for an ACSFF, and 100 through 102 for SFF's.

Each of the SFF's 100 through 102 has a system-ready clock pin T1, a data pin D1, a first scan-ready clock pin T2, a second scan-ready clock pin T3, and a scan-ready data pin D2. The ACSFF 100 comprises a system-ready clock pin T1, a data pin D1, a first scan-ready clock pin T2, a second scan-ready clock pin T3, a scan-ready data pin D2, and a switching control signal S1 for switchover between normal operation and delay test operation. The combinational circuit portion 1 has data input pins I1 through I4 and data output pins O1 through O4. A system clock signal 1000, a first scan clock signal 1001, a second scan clock signal 1002 and a switching control signal 1003 are input from outside the semiconductor integrated circuit.

In normal operation, the switching control signal 1003 is turned on. The ACSFF 10 and SFF's 100 through 102 receive system data through the data pin D1 in keeping with the system clock signal 1000, and outputs the data from an output pin Q.

Delay tests of the logic circuit will now be described. The delay tests include a scan-in operation for setting initial values to the FF's, a test operation for inputting data to the combinational circuit portion for testing, and a scan-out operation for reading output data out of the combinational circuit portion.

In the scan-in operation, the switching control signal 1003 is turned off, and the ACSFF 10 as well as the SFF's 100 through 102 are given initial values. The initial values are set by getting the random pattern generation circuit 2 to generate patterns and by inputting the generated patterns through the scan-in data pin D1 to the ACSFF 10 over a signal line 1004. From inside the ACSFF 100, the data are forwarded to the SFF 100, SFF 101 and SFF 102 in that order in accordance with the first scan-ready clock signal 1001 and second scan-ready clock signal 1002, whereby the initial values are set to the ACSFF 10 as well as to the SFF's 100 through 102.

In the test operation, two cycles of the system clock signal 1000 are applied. While the first cycle clock signal is being applied to the system clock 1000, the switching control signal 1003 is turned on. This causes the scan data placed in an internal DFF to be set to an EFF inside the ACSFF 10, and allows the data on the system-ready data pin D1 to be set to an EFF inside each of the SFF's 100 through 102. At this point, the data input pins I1 through I4 of the combinational circuit portion 1 receive output signals from the output terminals Q of the ACSFF 10 and SFF's 100 through 102. With the second cycle clock signal being applied to the system clock 1000, the switching control signal 1003 is turned off. This causes output data from the data output pins O1 through O4 to be fed to the system-ready data pins D1 of the ACSFF 10 and SFF's 100 through 102; the data are set to EFF's inside. If the combinational circuit portion 1 develops a signal propagation delay time failure, failure data are set to one of the FF's which is connected to the applicable signal path.

In the scan-out operation, the switching control signal 1003 is turned off, and the ACSFF 10 and SFF's 100 through 102 output their data to the pattern compression circuit 3. A check is then made to see if the scan-out data reveal any signal propagation delay time failure. In the above example, input patterns of scan-in data were shown to be generated by the random pattern generation circuit 2, and scan-out data were shown to be output to the pattern compression circuit 3. Alternatively, scan-in and scan-out data may be handled selectively by use of external pins.

Consider a conventional ACSFF arrangement having a control signal line for switchover between normal operation and test operation based on transition probabilities over a system data signal line. Introducing such an ACSFF arrangement into a logic circuit setup on a partial basis helps minimize any increase in the logic circuit area. With a system clock used for the delay test operation, the accuracy of the delay tests is enhanced. The inventive scheme above may also be applied to a logic circuit setup that employs SFF's on a partial basis.

The ACSFF shown in FIG. 12 switches between two kinds of data reception in accordance with an externally supplied signal. That is, either system data or scan data are received in keeping with the system clock signal. Below is a description of an ACSFF setup that has such a switchover operation triggered internally.

Figure 15:
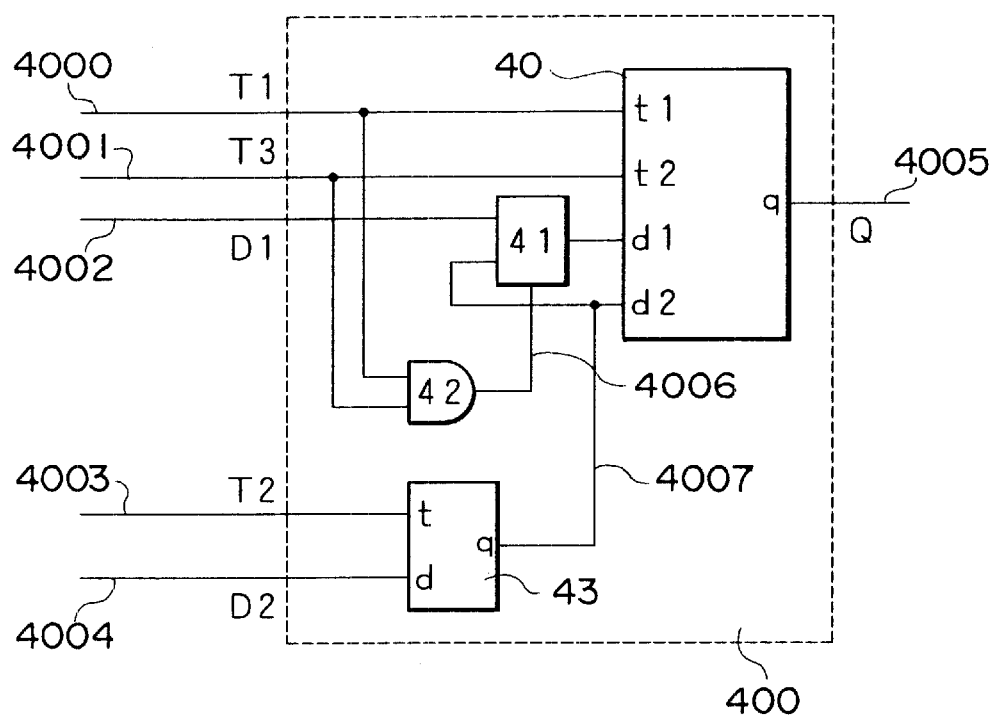
FIG. 15 is a block diagram of a delay test-ready scanning function-equipped storage device (ACSFF)

FIG. 15 shows a typical structure of an ACSFF using an internal switching signal. In FIG. 15, reference numeral 40 stands for an EFF, 43 for a DFF, 41 for a two-input selector and 42 for an AND circuit.

The EFF 40 has a system-ready clock pin t1, a data pin d1, a second scan-ready clock pin t2, and a data pin d2. The DFF 43 includes a first scan-ready clock pin t and a data pin d. The AND circuit 42 AND's a system clock signal 4000 with a second scan clock signal 4001 and outputs the result as an internal signal 4006. The two-input selector 41 receives system data 4002 and an output signal 4007 of the FF 43. If the internal signal 4006 is "1," the system data 4002 are selected; if the internal signal 4006 is "0," the output signal 4007 is selected. Two-phase clock signals of different phases are utilized as the first and the second scan clock signal.

Figure 16:
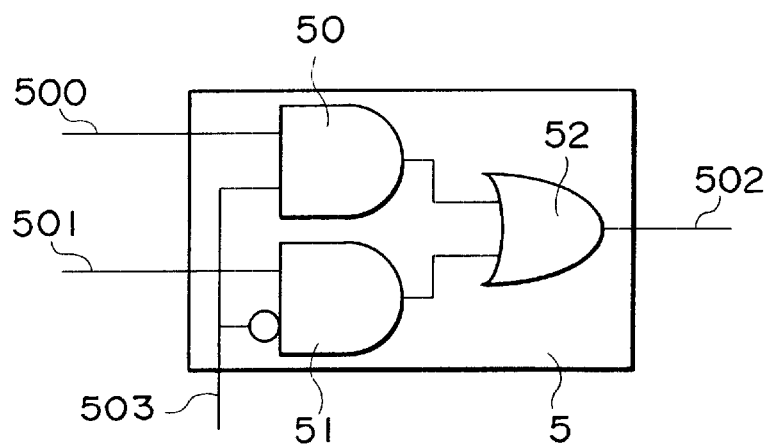
FIG. 16 is a schematic view depicting a circuit structure of a two-input selector.

FIG. 16 depicts an internal circuit structure of the two-input selector. The two-input selector comprises AND circuits and an OR circuit. When a selection signal line 503 is set to "1," the signal status of a data signal line 500 is output onto an output line 502; when the selection signal line 503 is set to "0," the signal status of a data signal line 501 is output onto the output line 502.

Figure 17:
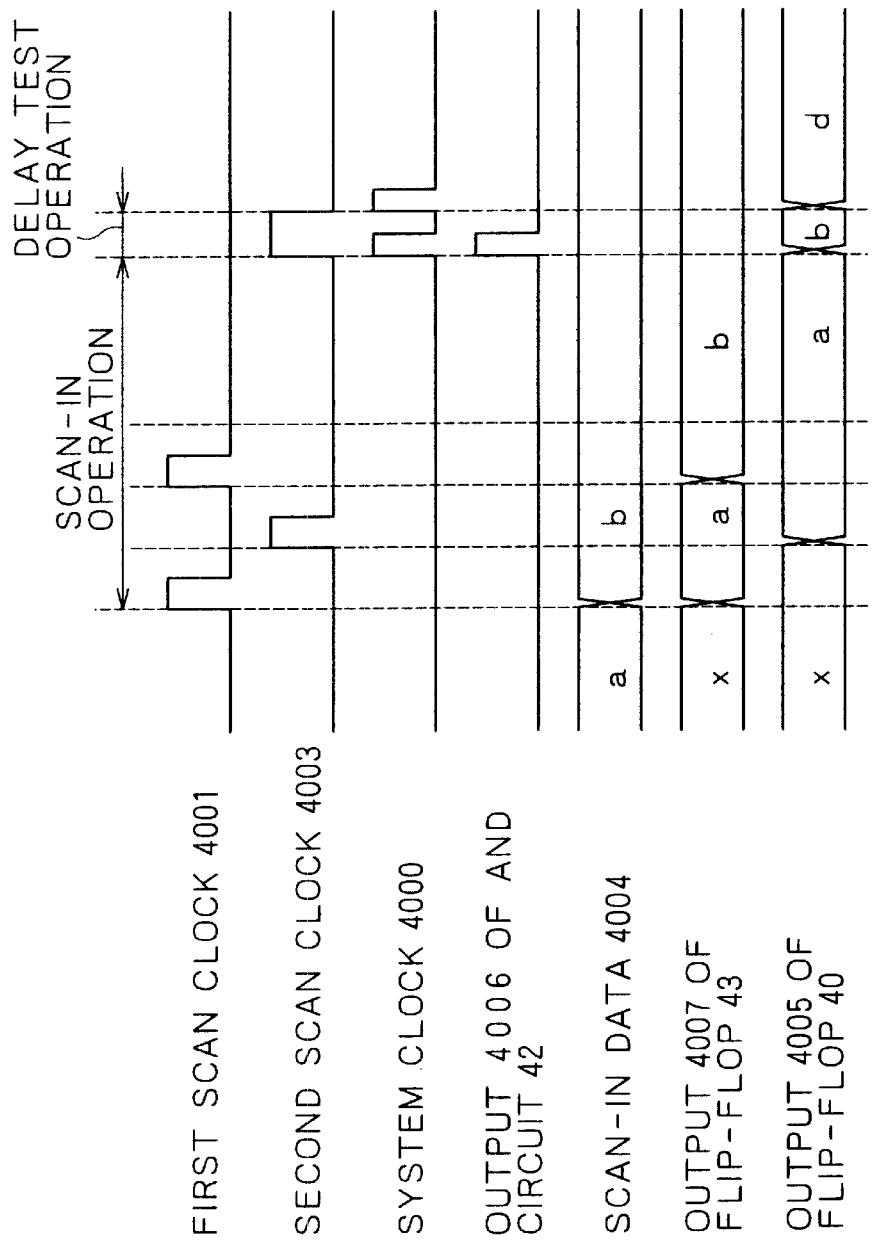
FIG. 17 is a timing chart of a delay test-ready scanning function-equipped storage element (ACSFF).

Below is a description of the workings of the ACSFF in FIG. 15 having the internal switching signal. Scan data D2 are input through a pin 4004. The scan data D2 from the pin 4004 are set to the DFF 43 in accordance with a first scan clock signal T2 from a pin 4003. The scan data placed in the DFF 43 are set to the EFF 40 in keeping with a second scan clock signal T3 from the pin 4001. The data are then output through a pin Q 4005 to the next scan chain, and the setting of the scan data is terminated. In an actual delay test operation, the output of the DFF 43 is selected depending on the AND of the system clock on the one hand and the second scan clock T3 4001 set to "1" in one cycle of the system clock T1 on the other hand. The scan data D2 are thus set to the EFF 40 in keeping with the system clock T1 4000. Based on the system clock T1 4000, the value of the system data D1 4002 is set to the EFF 40. FIG. 17 is a timing chart applicable to the ACSFF having the internal switching signal. When the scan clock and system clock are controlled as illustrated, the setup capable of internally generating a switching signal eliminates the need for a switching control signal.

Figure 18:
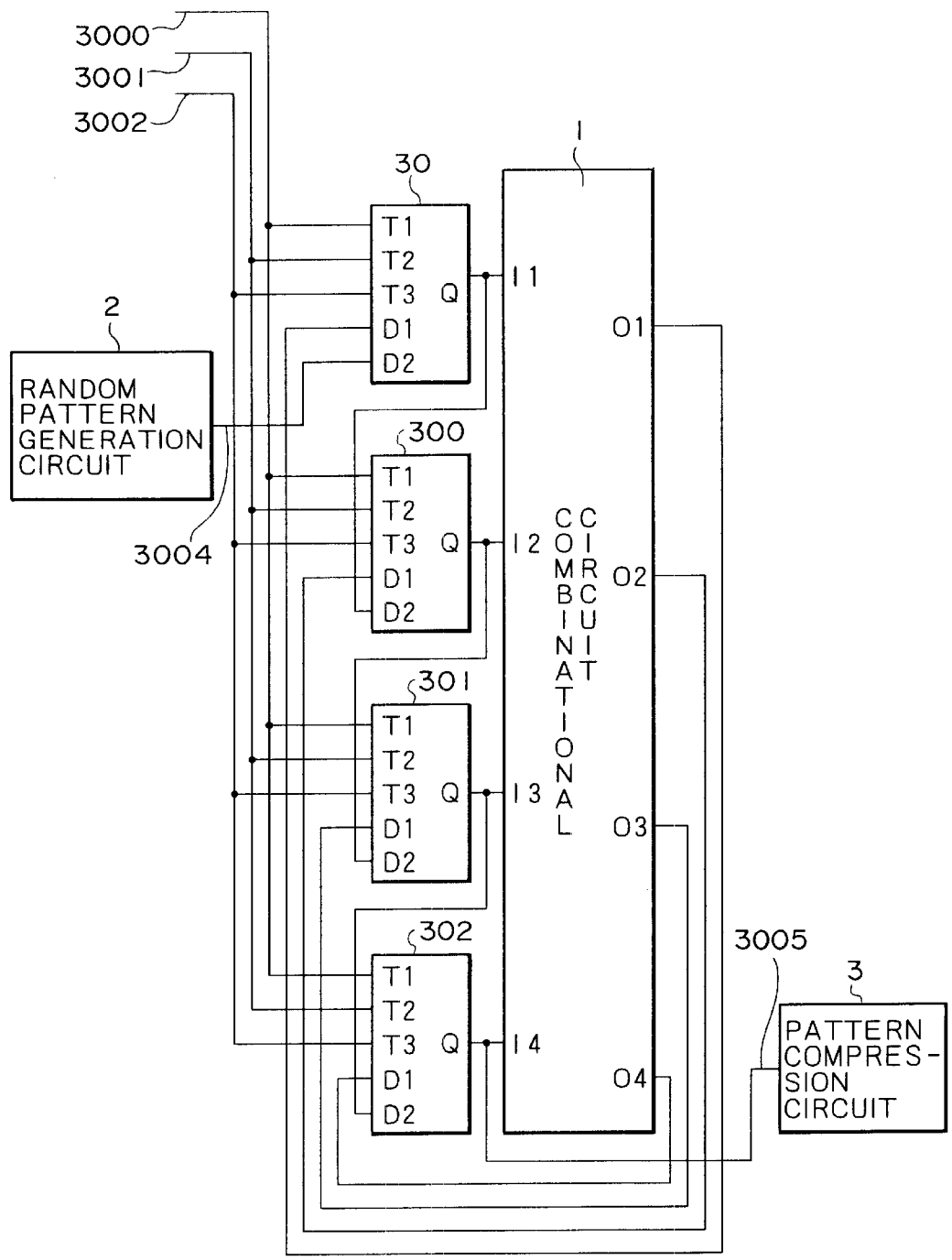
FIG. 18 is a block diagram of a logic circuit to which delay test-ready scanning function-equipped storage elements (ACSFF) are applied.

FIG. 18 is a block diagram of a semiconductor integrated circuit to which is applied an ACSFF capable of internally generating a switching signal on the basis of transition probabilities on a system data signal line. In FIG. 18, reference numeral 1 stands for a combinational circuit portion, 30 for the ACSFF capable of internally generating the switching signal, and 300 through 302 for SFF's.

The ACSFF 30 has a system-ready clock pin T1, a data pin D1, a second scan-ready clock pin T2, a first scan-ready clock pin T3, and a scan-ready data pin D2. Each of the SFF's 300 through 302 comprises a system-ready clock pin T1, a data pin D1, a scan-ready clock pin T2, and a data pin D2. The combinational circuit portion 1 under test includes data input pins I1 through I4 and data output pins O1 through O4. A system clock signal 3000, a first scan clock signal 3001, and a second scan clock signal 3002 are input from outside the semiconductor integrated circuit.

In normal operation of a logic circuit arrangement having the structure outlined above, the ACSFF 30 and SFF's 300 through 302 receive system data D1 in accordance with the system clock 3000, and forward the data to their output terminals Q.

Delay test-related operations performed by the components of the logic circuit are described below. A scan-in operation sets initial values to the ACSFF 30 and SFF's 300 through 302. The initial values are set by getting a random pattern generation circuit 2 to generate patterns and by inputting the generated patterns through a scan-in data pin 3004 to each FF by use of the first and second scan clock signals 3001 and 3002.

Two cycles of the system clock 3000 are applied so as to check the combinational circuit portion 1 in a test operation. While the first cycle clock signal is being applied to the system clock 1000, the second scan clock signal is set to "1." This causes the scan data placed in an internal DFF to be set to an EFF inside the ACSFF 30, and allows the data on the system-ready data pin D1 to be set to an EFF inside each of the SFF's 300 through 302. At this point, the data input pins I1 through I4 of the combinational circuit portion 1 receive output signals from the output terminals Q of the ACSFF 30 and SFF's 300 through 302. Then with the second cycle clock signal being applied to the system clock 3000, the data from the data output pins O1 through O4 of the combinational circuit portion 1 are set to the system-ready data pins D1 of the ACSFF 30 and SFF's 300 through 302. If the combinational circuit portion 1 develops a signal propagation delay time failure, failure data are set to one of the FF's which is connected to the applicable signal path. Thereafter, the value of each ACSFF is output to the pattern compression circuit 3 through a scan data-out pin 3005 using the first and second scan clock signals 3001 and 3002. A check is made to see if the scan-out data reveal any signal propagation delay time failure. In the above example, input patterns of scan-in data were shown to be generated by the random pattern generation circuit 2, and scan-out data were shown to be output to the pattern compression circuit 3. Alternatively, scan-in and scan-out data may be handled selectively by use of external pins.

Discussed above was the ACSFF capable of internally generating the ACSFF switching signal on the basis of transition probabilities on the system data signal line. Introducing such an ACSFF arrangement partially into a logic circuit setup helps minimize any increase in the logic circuit area and eliminates the need for installing a switching control signal line capable of propagating a signal equivalent to the system clock. With the system clock used for the delay test operation, the accuracy of the delay tests is enhanced. The inventive scheme above may also be applied to a logic circuit setup that incorporates SFF's on a partial basis.

FIG. 19 shows a typical structure of a semiconductor integrated circuit formed by having all SFF's equipped with an ACSFF capable of internally generating a switching signal. In FIG. 19, reference numeral 1 stands for a combinational circuit portion, and 200 through 203 for ACSFF's capable of internally generating the switching signal each.

Each of the ACSFF's 200 through 203 has a system-ready clock pin T1, a data pin D1, a first scan-ready clock pin T2, a second scan-ready clock pin T3, and a scan-ready data pin D3. The combinational circuit portion 1 comprises data input pins I1 through I4 and data output pins O1 through O4. A system clock signal 3000, a first scan clock signal 3001, and a second scan clock signal 3002 are input from outside the semiconductor integrated circuit.

Described below is a typical setup, like the ones described above, into which the ACSFF's for internally generating a switching signal are introduced.

In normal operation, the ACSFF's 200 through 203 receive system data D1 in accordance with the system clock signal 2000, and forward the data to their output terminals Q.

Delay test operations include a scan-in operation for setting initial values to the ACSFF's, a test operation for inputting data to the combinational circuit portion for testing, and a scan-out operation for reading output data out of the combinational circuit portion. Each of these operations is described below.

In the scan-in operation, the ACSFF's 200 through 203 are given initial values. The initial values are set by getting the random pattern generation circuit 2 to generate patterns and by inputting the generated patterns through a scan-in data pin 2004 to each ACSFF by use of the first and second scan-ready clock signals 2001 and 1002. Two-phase clock signals of different phases are utilized as the first and second scan clock signals. In the test operation, Two cycles of the system clock 2000 are applied so as to check the combinational circuit portion 1. While the first cycle clock signal is being applied to the system clock 2000, the second scan clock signal is set to "1." This causes the scan data placed in an internal DFF to be set to an EFF inside each of the ACSFF's 200 through 203. At this point, the data input pins I1 through I4 of the combinational circuit portion 1 receive output signals from the output terminals Q of the ACSFF's 200 through 203. With the second cycle clock signal being applied to the system clock 2000, the data from the data output pins O1 through O4 of the combinational circuit portion 1 are set to the EFF in each ACSFF. If the combinational circuit portion 1 develops a signal propagation delay time failure, failure data are set to one of the ACSFF's which is connected to the applicable signal path. Thereafter, the value of each ACSFF is output to the pattern compression circuit 3 through a scan data-out pin 2005 using the first and second scan clock signals 2001 and 2002. A check is made to see if the scan-out data reveal any signal propagation delay time failure. In the above example, input patterns of scan-in data were shown to be generated by the random pattern generation circuit 2, and scan-out data were shown to be output to the pattern compression circuit 3. Alternatively, scan-in and scan-out data may be handled selectively by use of external pins.

Installing ACSFF's each capable of internally generating a switching signal eliminates the need for a switching control signal line that would require the wiring of a control signal line for propagating a signal equivalent to the system clock. Because the system clock is used for the delay test operation, the accuracy of the delay tests is enhanced.

Figure 20:
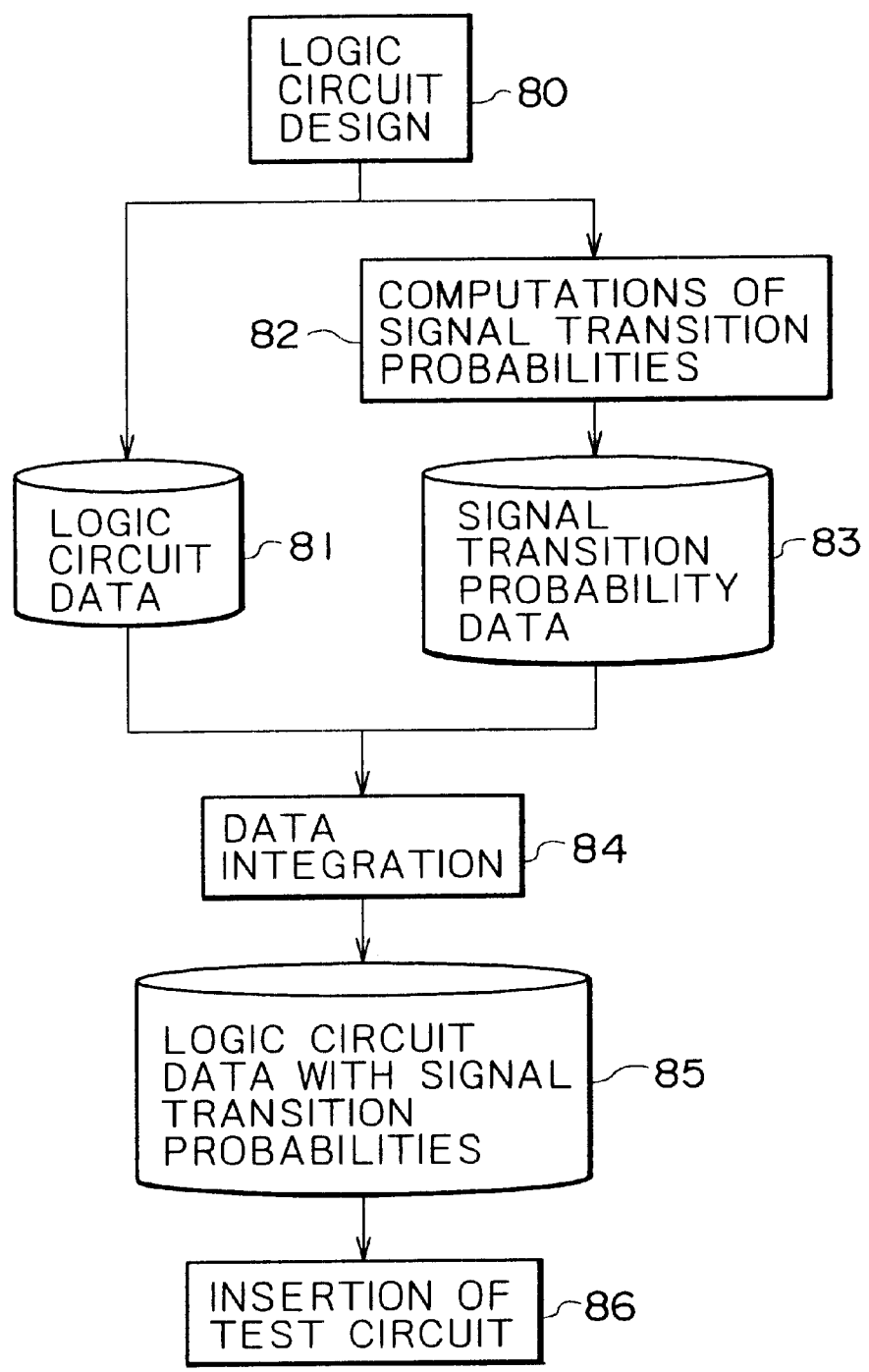
FIG. 20 is a flowchart that depicts integration of logic circuit data.

FIG. 20 is a flowchart of steps for generating logic circuit data allowing a test circuit to be inserted. Logic circuit design data 81 are used to compute signal transition probabilities in the manner described earlier. Data 83 representing the computed signal transition probabilities are integrated with the logic circuit design data 81 to make up logic circuit data with the signal transition probabilities. Creating the logic circuit data having the signal transition capabilities makes it possible to determine how to insert SFF's. The logic circuit data thus created allow other circuit designers to design semiconductor integrated circuits based on the same logic circuit design.

As described, the invention provides a semiconductor integrated circuit subject to a minimum of increase in its logic circuit area. The inventive semiconductor integrated circuit resolves the major problems of delay tests caused by signal delays. Furthermore, the invention is conducive to reducing the number of steps for developing test patterns.

What is claimed is:

1. A semiconductor integrated circuit comprising:
  a logic circuit made of a plurality of logic elements;
  a first storage element which stores data in keeping with a system clock signal for controlling said logic circuit in operation and which further stores scan data in accordance with a scan clock signal for testing said logic circuit; and
  a second storage element which stores data in keeping with said system clock signal and which further stores scan data in accordance with either said system clock signal or said scan clock signal.

2. A semiconductor integrated circuit according to claim 1, wherein said second storage element selects either said system clock signal or said scan clock signal based on an externally supplied signal, said second storage element further storing the scan data in accordance with the selected clock signal.

3. A semiconductor integrated circuit according to claim 1, wherein said second storage element receives said system clock signal and said scan clock signal, selects either said system clock signal or said scan clock signal based on parameters of the two signals, and stores the scan data in keeping with the selected clock signal.

4. A semiconductor integrated circuit comprising:
  a logic circuit made of a plurality of logic elements; and
  a storage element which stores data in keeping with a system clock signal for controlling said logic circuit in operation and which further stores scan data either in accordance with a scan clock signal for testing said logic circuit or in keeping with said system clock signal.

5. A semiconductor integrated circuit according to claim 4, wherein said storage element receives said system clock signal and said scan clock signal, selects either said system clock signal or said scan clock signal based on parameters of the two signals, and stores the scan data in keeping with the selected clock signal.

6. A semiconductor integrated circuit comprising:
  a logic circuit made of a plurality of logic elements;
  a first storage element which stores data in accordance with a system clock signal for controlling said logic circuit in operation and which further stores scan data in keeping with a scan clock signal for testing said logic circuit; and
  a second storage element which stores data in accordance with said system clock signal and which further stores scan data in keeping with either said system clock signal or said scan clock signal;
  wherein said second storage element internally generates a switching signal for selecting either said scan clock signal or said system clock signal as the clock signal according to which the scan data are received.

7. Logic circuit data about a circuit comprising:
  a logic circuit made of a plurality of logic elements;
  a first storage element which stores data in accordance with a system clock signal for controlling said logic circuit in operation and which further stores scan data in keeping with a scan clock signal for testing said logic circuit; and
  a second storage element which stores data in accordance with said system clock signal and which further stores scan data in keeping with either said system clock signal or said scan clock signal.

* * * * *